United States Patent [19]
Pantelakis et al.

[11] Patent Number: 5,929,659
[45] Date of Patent: Jul. 27, 1999

[54] CIRCUIT AND PROCESS FOR SENSING DATA

[75] Inventors: Dimitris C. Pantelakis; Wai Tong Lau; John Eagan, all of Austin, Tex.

[73] Assignee: Motorola, Inc., Schaumburg, Ill.

[21] Appl. No.: 08/815,526

[22] Filed: Mar. 12, 1997

[51] Int. Cl.⁶ .............................. H03K 3/356; G11C 7/06
[52] U.S. Cl. .................. 327/55; 327/57; 327/215
[58] Field of Search .................. 327/51, 52, 53, 327/55–57, 89, 65, 54, 215; 330/253; 365/205, 207, 208

[56] References Cited

U.S. PATENT DOCUMENTS

| | | | |
|---|---|---|---|
| 5,410,197 | 4/1995 | Krenik | 327/52 |
| 5,568,438 | 10/1996 | Penchuk | 327/52 |
| 5,657,276 | 8/1997 | Pascucci | 327/52 |
| 5,703,803 | 12/1997 | Shadan et al. | 327/52 |

OTHER PUBLICATIONS

Evert Seevinck, et al., "Current–Mode Techniques for High–Speed VLSI Circuits with Application to Current Sense Amplifier for CMOS SRAM's", Apr. 1991 IEEE Journal of Solid–State Circuits, vol. 26, No. 4, pp. 525–535.

*Primary Examiner*—My-Trang Nu Ton
*Attorney, Agent, or Firm*—Paul J. Polansky

[57] ABSTRACT

A sense amplifier (10) senses data by sensing a differential current signal comprised of a current ($I_1$) flowing in an input terminal (12) and a current ($I_2$) flowing in a complementary input terminal (22). During the sensing process, the sense amplifier (10) generates a first current flowing in a first FET (17) in accordance with the current ($I_1$) flowing through the input terminal (12) and a second current flowing in a second FET (27) in accordance with the current ($I_2$) flowing through the complementary input terminal (22). Two cross coupled inverters (16, 26) compare the first current ($I_1$) with the second current ($I_2$) and generate a differential output voltage signal, thereby sensing the data.

20 Claims, 3 Drawing Sheets

CIRCUIT AND PROCESS FOR SENSING DATA

CROSS REFERENCE TO RELATED, COPENDING APPLICATION

The present application is related to the following U.S. patent application: "MEMORY DEVICE WITH FAST WRITE RECOVERY AND RELATED WRITE RECOVERY METHOD", invented by Dimitris C. Pantelakis, William L. Martino, Jr., Derrick Leach, Frank Miller, and Wai Tong Lau, appication ser. No. 08/815,527, filed concurrently herewith and assigned to the assignee hereof, now U.S. Pat. No. 5,777,935, issued July 7, 1998.

BACKGROUND OF THE INVENTION

The present invention relates, in general, to sensing data and, more particularly, to using a sense amplifier to sense the data.

BACKGROUND OF THE INVENTION

Sense amplifiers are widely used to sense data from memory cells. When sensing data from a memory cell, the sense amplifier senses and amplifies a voltage difference between the complementary bit lines of the memory cell. A conventional sense amplifier includes a high gain differential voltage amplifier, which consumes large amounts of current and, therefore, power. Further, the sensing process generates a large voltage swing across the complementary bit lines. Because of the parasitic capacitance of the complementary bit lines, the large voltage swing degrades the data transmission speed/power product. Therefore, conventional sense amplifiers are unsuitable for low power and high speed applications.

Accordingly, it would be advantageous to have a circuit and a process for sensing data. It is desirable for the circuit to be simple and power efficient. It is also desirable for the sensing process to be fast. In addition, it would be of advantage for the circuit and the process to be compatible with standard complementary metal oxide semiconductor (CMOS) logic levels.

DETAILED DESCRIPTION OF A PREFERRED EMBODIMENT

Generally, the present invention provides a circuit and a process for sensing data from a differential current signal. By way of example, the differential current signal is transmitted to the circuit via a bit line and a complementary bit line, which are also referred to as complementary bit lines. In accordance with the present invention, the circuit senses data by sensing the currents flowing in the complementary bit lines. During the sensing process, the voltage swing across the complementary bit lines is maintained at a minimum level. Further, the circuit does not include a high gain differential voltage amplifier. Therefore, the circuit and the data sensing process are power efficient and can be used in high speed applications.

Figure 1:
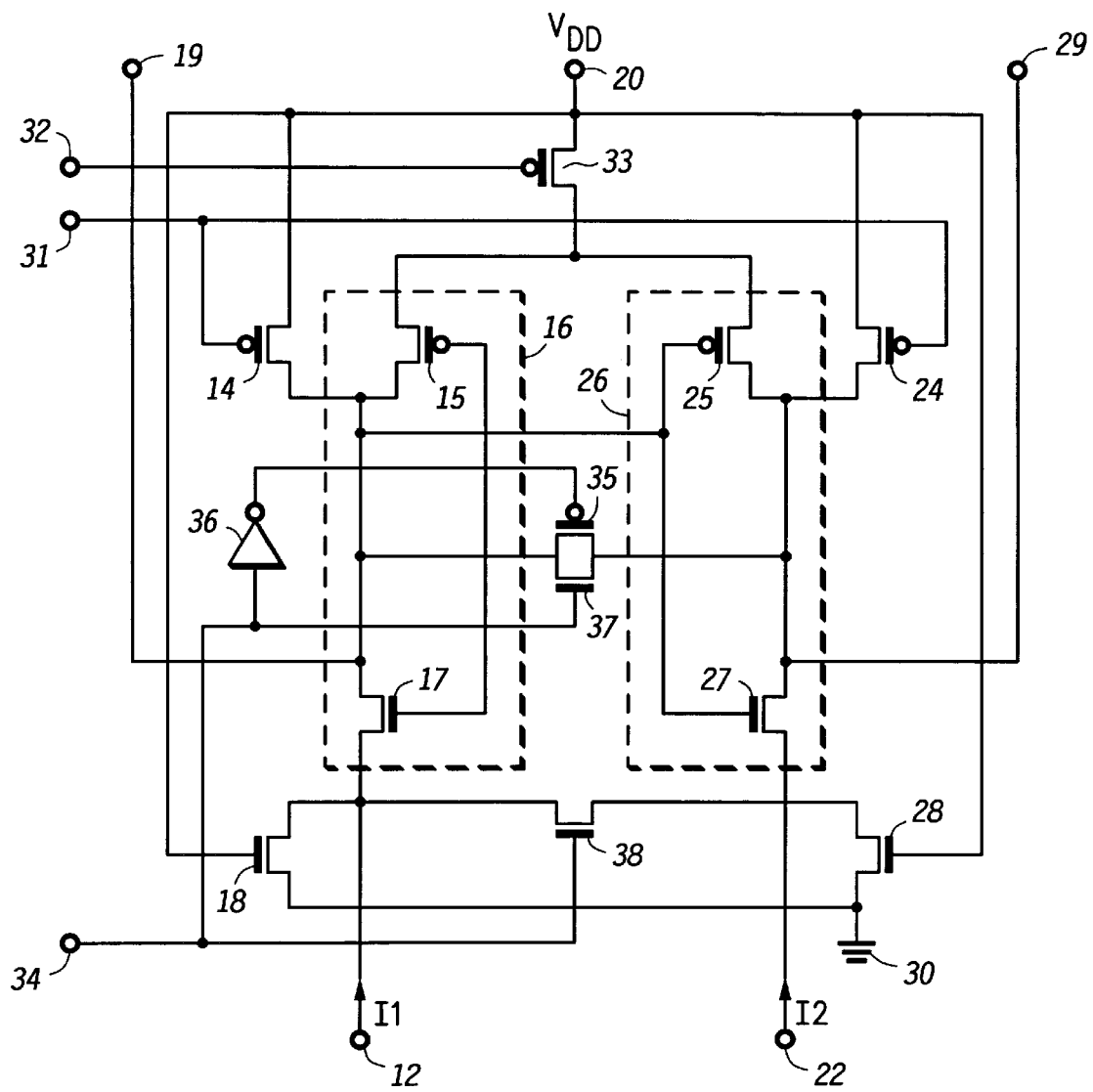
FIG. 1 is a schematic diagram of a current sensing circuit in accordance with the present invention.

FIG. 1 is a schematic diagram of a current sensing circuit 10 which may be connected to the read global data lines to complete the current sensing function. Current sensing circuit 10 is a part of a data I/O circuit a memory. Current sensing circuit 10 senses the difference between currents $I_1$ and $I_2$ flowing into current sensing circuit 10 through an input terminal 12 and a complementary input terminal 22, respectively. The difference between currents $I_1$ and $I_2$ is used for sensing the data transmitted to current sensing circuit 10. Input terminal 12 and complementary input terminal 22 are coupled to GDL and GDL, respectively. Current sensing circuit 10 is also referred to as a sense amplifier.

Sense amplifier 10 includes P-channel insulated gate field effect transistors (FETs) 14 and 24 which serve as current sources. The gate electrodes of FETs 14 and 24 are connected to a terminal 31 for receiving a first enabling signal. The source electrodes of FETs 14 and 24 are connected to a voltage supply conductor 20. By way of example, conductor 20 is at a voltage level of $V_{DD}$. In other words, the source electrodes of FETs 14 and 24 are connected to the voltage level $V_{DD}$. Sense amplifier 10 also includes a P-channel insulated gate FET 33 having a gate electrode connected to a terminal 32 for receiving a second enabling signal and a source electrode connected to the voltage level $V_{DD}$ at conductor 20.

Sense amplifier 10 further includes an inverter 16, an N-channel insulated gate FET 18, an inverter 26, and an N-channel insulated gate FET 28. Inverter 16 is comprised of a P-channel insulated gate FET 15 and an N-channel insulated gate FET 17. The gate electrodes of FETs 15 and 17 are commonly connected to form an input of inverter 16. A source electrode of FET 15 serves as a first biasing node of inverter 16 and is connected to a drain electrode of FET 33. A source electrode of FET 17 serves as a second biasing node of inverter 16 and is connected to a drain electrode of FET 18 and to input terminal 12. The drain electrodes of FETs 15 and 17 are commonly connected to form an output of inverter 16. The output of inverter 16 is connected to a drain electrode of FET 14 and to a data output terminal 19 of sense amplifier 10.

Inverter 26 is comprised of a P-channel insulated gate FET 25 and an N-channel insulated gate FET 27. The gate electrodes of FETs 25 and 27 are commonly connected to form an input of inverter 26. A source electrode of FET 25 serves as a first biasing node of inverter 26 and is connected to the drain electrode of FET 33. A source electrode of FET 27 serves as a second biasing node of inverter 26 and is connected to a drain electrode of FET 28 and to complementary input terminal 22. The drain electrodes of FETs 25 and 27 are commonly connected to form an output of inverter 26. The output of inverter 26 is connected to a drain electrode of FET 24 and to a complementary data output terminal 29 of sense amplifier 10.

Further, the input of inverter 16 is connected to the output of inverter 26, and the input of inverter 26 is connected to the output of inverter 16. The gate electrodes of FETs 18 and 28 are connected to the voltage level $V_{DD}$ at conductor 20. The source electrodes of FETs 18 and 28 are connected to a voltage supply conductor 30. By way of example, voltage supply conductor 30 is at a ground voltage level, i.e., $V_{SS}$.

Sense amplifier 10 further includes an inverter 36 and two switches, one coupled between the outputs of inverters 16 and 26, and the other coupled between the second biasing nodes of inverters 16 and 26. Preferably, the switch coupled between the outputs of inverters 16 and 26 is a two transistor pass gate comprised of a P-channel insulated gate FET 35 and an N-channel insulated gate FET 37. An input of inverter 36 is connected to a terminal 34 for receiving an equalization signal. An output of inverter 36 is connected to a gate electrode of FET 35. A gate electrode of FET 37 is connected to terminal 34. The source electrodes of FETs 35 and 37 are commonly connected to the drain electrodes of FETs 15 and 17. The drain electrodes of FETs 35 and 37 are commonly connected to the drain electrodes of FETs 25 and 27.

Preferably, the switch coupled between the second biasing nodes of inverters 16 and 26 is a one transistor pass gate comprised of an N-channel insulated gate FET 38. A gate electrode of FET 38 is connected to terminal 34, a source electrode of FET 38 is connected to the source electrode of FET 17, and a drain electrode of FET 38 is connected to the source electrode of FET 27.

As described in more detail hereinafter with reference to FIG. 2, sense amplifier 10 senses data by sensing a differential current signal transmitted to input terminal 12 and complementary input terminal 22. More particularly, sense amplifier 10 senses currents $I_1$ and $I_2$ flowing through input terminal 12 and complementary input terminal 22, respectively. Currents $I_1$ and $I_2$ are also referred to as first and second current components of the differential current signal. Sense amplifier 10 generates two currents, one flowing in FET 17 and the other flowing in FET 27, in accordance with currents $I_1$, and $I_2$. Sense amplifier 10 then compares the current flowing in FET 17 with the current flowing in FET 27 to sense the data.

It should be noted that FETs 14, 15, 17, 18, 24, 25, 27, 28, 33, 35, 37, and 38 are not limited to being insulated gate FETs as shown in FIG. 1. They can be replaced with other kinds of transistors such as, for example, bipolar transistors, metal semiconductor FETs, junction FETs, insulated gate bipolar transistors, etc. Further, FET 33 functions as a switch and can be replaced by any kind of switch. As those skilled in the art are aware, for a FET, the gate electrode serves as a control electrode, and the source and drain electrodes serve as current conducting electrodes.

In sense amplifier 10, FETs 14 and 24 function as current sources, and FETs 18 and 28 function as current sinks. They can be replaced by other kinds of current source/sink circuits. Preferably, FETs 14 and 18 have substantially the same current carrying capabilities as FETs 24 and 28, respectively.

In inverter 16, FET 15 functions as a pull-up transistor and FET 17 functions as a pull-down transistor, and therefore, FETs 15 and 17 are preferably of different conductivity types. Likewise in inverter 26, FET 25 functions as a pull-up transistor and FET 27 functions as a pull-down transistor, and therefore, FETs 25 and 27 are preferably of different conductivity types. In the embodiment shown in FIG. 1, FETs 15 and 25 are P-channel FETs and FETs 17 and 27 are N-channel FETs. In an alternative embodiment, FETs 15 and 25 are replaced by PNP bipolar transistors and FETs 17 and 27 are replaced by NPN bipolar transistors.

FET 38 functions as a pass gate and can be replaced by a different type of pass gate, e.g., a two transistor pass gate. FETs 35 and 37 form a two transistor pass gate and can be replaced by a different type of pass gate. The two pass gates provide sense amplifier 10 with the capability of performing high speed back-to-back sensing operations. It should be noted that both pass gates are optional in sense amplifier 10. Because of the large voltage swing, e.g., from ground voltage level to $V_{DD}$, across output terminal 19 and complementary output terminal 29, the pass gate coupled therebetween is preferably a two transistor pass gate as shown in FIG. 1. However, this is not intended as a limitation of the present invention. If a one transistor pass gate is used in place of FETs 35 and 37, the equalization signal applied to its control electrode is preferably adjusted to provide it with bi-directional conduction capability during the operation of sense amplifier 10.

Figure 2:
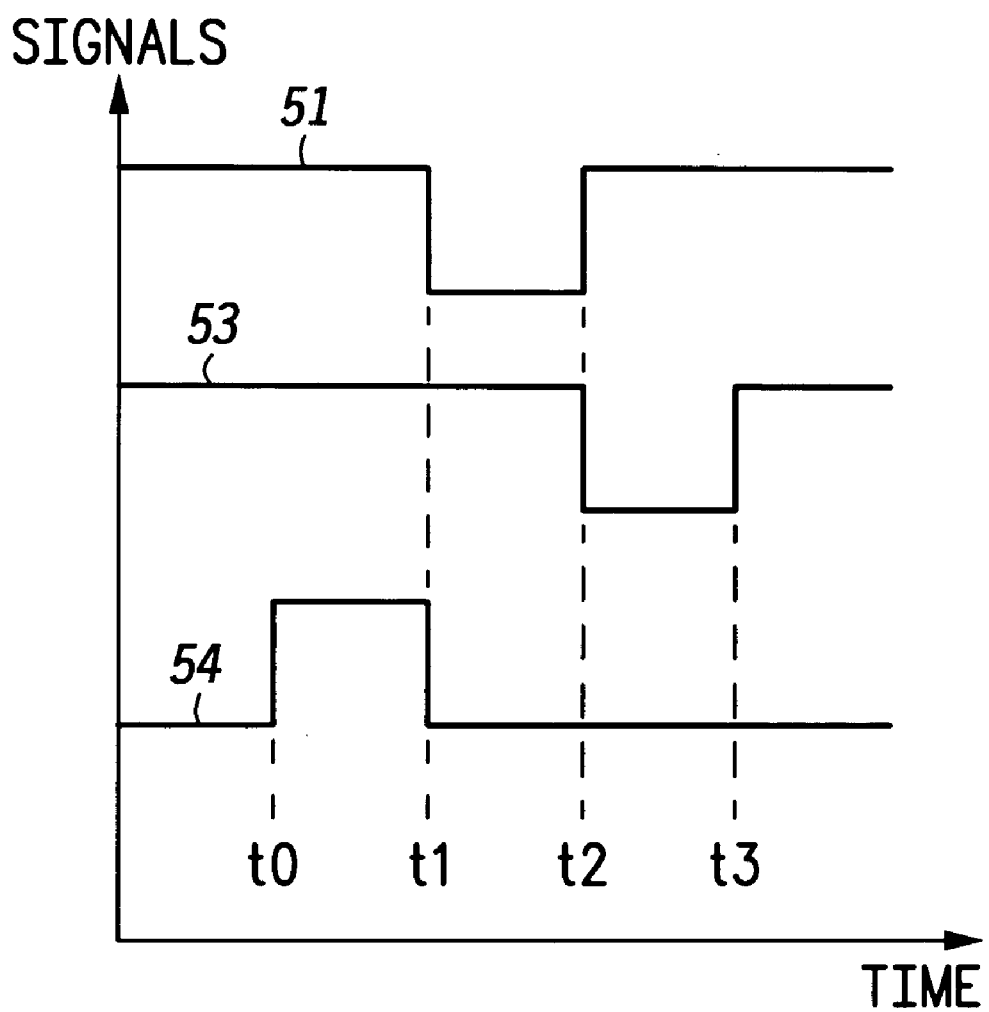
FIG. 2 is a timing diagram of signals applied to the current sensing circuit of FIG. 1 during a data sensing process.

FIG. 2 is a timing diagram 50 of signals applied to a current sensing circuit during a data sensing process in accordance with the present invention. Timing diagram 50 includes a first enabling signal 51, a second enabling signal 52, and an equalization signal 54. When using sense amplifier 10 of FIG. 1 to sense data, first enabling signal 51, second enabling signal 52, and equalization signal 54 are applied to terminals 31, 32, and 34, respectively. Input terminal 12 and complementary input terminal 22 are coupled to a memory cell via bit lines, read data lines, and global data lines. In another example, input terminal 12 and complementary input terminal 22 are coupled to two memory cells (not shown) via a multiplexer (not shown). One memory cell is referred to as a primary memory cell and the other memory cell is referred to as a redundant memory cell. The multiplexer selects the primary memory cell in normal operation and selects the redundant memory cell if the primary memory cell is defective.

When sense amplifier 10 is idle, first enabling signal 51 and second enabling signal 52 are preferably at a high voltage level such as, for example, supply voltage $V_{DD}$, and equalization signal 54 is preferably at a low voltage level such as, for example, ground voltage level. Therefore, FETs 14, 24, 33, 35, 37, 38 are nonconductive, inverters 16 and 26 are disabled, and sense amplifier 10 does not consume significant power.

Before the sensing process starts, equalization signal 54 is switched to a high voltage level, such as $V_{DD}$, at a time to. The high voltage level is transmitted to the gate electrodes of FETs 37 and 38 and switches FETs 37 and 38 on. The high voltage level is also transmitted to the input of inverter 36, which generates a low voltage level at the gate electrode of FET 35 and switches FET 35 on. Conductive FETs 35 and 37 substantially equalize the potentials at output terminal 19 and complementary output terminal 29. Likewise, conductive FET 38 substantially equalizes the potentials at input terminal 12 and complementary input terminal 22.

The sensing process starts at a time $t_0$, when equalization signal 54 is switched back to the low voltage level and first enabling signal 51 is switched to a low voltage level, such as ground voltage level. FETs 35, 37, and 38 are switched off, thereby isolating output terminal 19 from complementary output terminal 29 and isolating input terminal 12 from complementary input terminal 22. FETs 14 and 24 are switched on. Two current paths are established between $V_{DD}$ and ground, one through FETs 14, 17, and 18, and the other through FETs 24, 27, and 28. It should be noted that, although FIG. 2 shows the falling edge of first enabling signal 51 coinciding with the falling edge of equalization signal 54, this is not intended as a limitation of the present invention.

The data stored in the memory cell is encoded in currents $I_1$ and $I_2$ and transmitted to sense amplifier 10 via input terminal 12 and complementary input terminal 22. Current $I_1$ flows from the memory cell to conductor 30 via input terminal 12 and FET 18. Thus, the current flowing in FET 18 is equal to the sum of current $I_1$, and the current flowing in FETs 14 and 17. Likewise, current $I_2$ flows from the memory cell to conductor 30 via complementary input terminal 22 and FET 28. Thus, the current flowing in FET 28 is equal to the sum of current 12 and the current flowing in FETs 24 and 27. Because FETs 18 and 28 are designed to have substantially the same current carrying capability, the current flowing in FET 18 is substantially equal to the current flowing in FET 28. This current is referred to as a reference current. Therefore, the current flowing in FETs 14 and 17 is substantially equal to the reference current minus current $I_1$. Similarly, the current flowing in FETs 24 and 27 is substantially equal to the reference current minus current $I_2$. Sense amplifier 10 senses the data by comparing the current flowing in FETs 14 and 17 with the current flowing in FETs 24 and 27.

If the memory cell stores a first logic value, e.g., a logic "1", current $I_1$ is slightly greater than current $I_2$. Typically, the difference between currents $I_1$ and $I_2$ ranges between approximately 40 micro-amperes ($\mu A$) and approximately 80 $\mu A$. A nominal value for the current difference is approximately 60 $\mu A$. The current flowing in FETs 14 and 17 is less than the current flowing in FETs 24 and 27 by substantially the same amount that current $I_1$ is greater than current $I_2$. The smaller current flowing in FET 14 than that flowing in FET 24 develops a smaller voltage drop across the drain and source electrodes of FET 14 than that across the drain and source electrodes of FET 24. Consequently, the voltage level at the drain electrodes of FETs 15 and 17 is slightly higher than the voltage level at the drain electrodes of FETs 25 and 27.

On the other hand, if the memory cell stores a second logic value, e.g., a logic "0", which is complementary to the first logic value, current $I_1$ is slightly less than current $I_2$. The current flowing in FETs 14 and 17 is greater than the current flowing in FETs 24 and 27 by substantially the same amount that current $I_1$ is less than current $I_2$. The larger current flowing in FET 14 than that flowing in FET 24 develops a larger voltage drop across the drain and source electrodes of FET 14 than that across the drain and source electrodes of FET 24. Consequently, the voltage level at the drain electrodes of FETs 15 and 17 is slightly lower than the voltage level at the drain electrodes of FETs 25 and 27.

At a time $t_2$, first enabling signal 51 is switched back to the high voltage level and second enabling signal 52 is switched to a low voltage level, such as ground voltage level. FETs 14 and 24 are switched off, FET 33 is switched on, and inverters 16 and 26 are enabled. In response to the voltage across the drain electrodes of FETs 17 and 27, inverters 16 and 26 form a latch circuit which generates a differential voltage signal across output terminal 19 and complementary output terminal 29.

When the memory cell stores a logic "1", the voltage level at the drain electrodes of FETs 15 and 17 is slightly higher than the voltage level at the drain electrodes of FETs 25 and 27. The higher voltage level at the drain electrodes of FETs 15 and 17 is transmitted to the gate electrodes of FETs 25 and 27, turning off FET 25 and turning on FET 27. Likewise, the lower voltage level at the drain electrodes of FETs 25 and 27 is transmitted to the gate electrodes of FETs 15 and 17, turning on FET 15 and turning off FET 17. With FET 15 conductive and FET 17 nonconductive, inverter 16 pulls the voltage level at output terminal 19 up to $V_{DD}$. With FET 25 nonconductive and FET 27 conductive, inverter 26 pulls the voltage level at complementary output terminal 29 down to ground. Thus, a logic "1" is read from the memory cell.

When the memory cell stores a logic "0", the voltage level at the drain electrodes of FETs 15 and 17 is slightly lower than the voltage level at the drain electrodes of FETs 25 and 27. The lower voltage level at the drain electrodes of FETs 15 and 17 is transmitted to the gate electrodes of FETs 25 and 27, turning on FET 25 and turning off FET 27. Likewise, the higher voltage level at the drain electrodes of FETs 25 and 27 is transmitted to the gate electrodes of FETs 15 and 17, turning off FET 15 and turning on FET 17. With FET 15 nonconductive and FET 17 conductive, inverter 16 pulls the voltage level at output terminal 19 down to ground. With FET 25 conductive and FET 27 nonconductive, inverter 26 pulls the voltage level at complementary output terminal 29 up to $V_{DD}$. Thus, a logic "0" is read from the memory cell.

The sensing process ends at a time $t_3$ when second enabling signal 52 is switched back to the high voltage level. The high voltage level at terminal 32 switches off FET 33, thereby disabling inverters 16 and 26. Sense amplifier 10 enters an idle state and is ready for the next data sensing process.

During the data sensing process, FETs 18 and 28 remain conductive. Therefore, the voltage levels at input terminal 12 and complementary input terminal 22 remain close to ground voltage level. In other words, the voltage swing across the global data line coupled to input terminal 12 and the complementary global data line coupled complementary input terminal 22 is small, e.g., less than approximately 20 milli-volts (mV).

Because of the small voltage swing, sense amplifier 10 is suitable for high speed and long bit line applications. Further, sense amplifier 10 does not include a high gain differential voltage amplifier that drains a large current. Therefore, sense amplifier 10 is power efficient compared with prior art sense amplifiers. When sense amplifier 10 generates its output, the voltage levels at output terminal 19 and complementary output terminal 29 are either pulled up to $V_{DD}$ or pulled down to ground. Therefore, sense amplifier 10 and the sensing process are compatible with standard CMOS logic levels.

Figure 3:
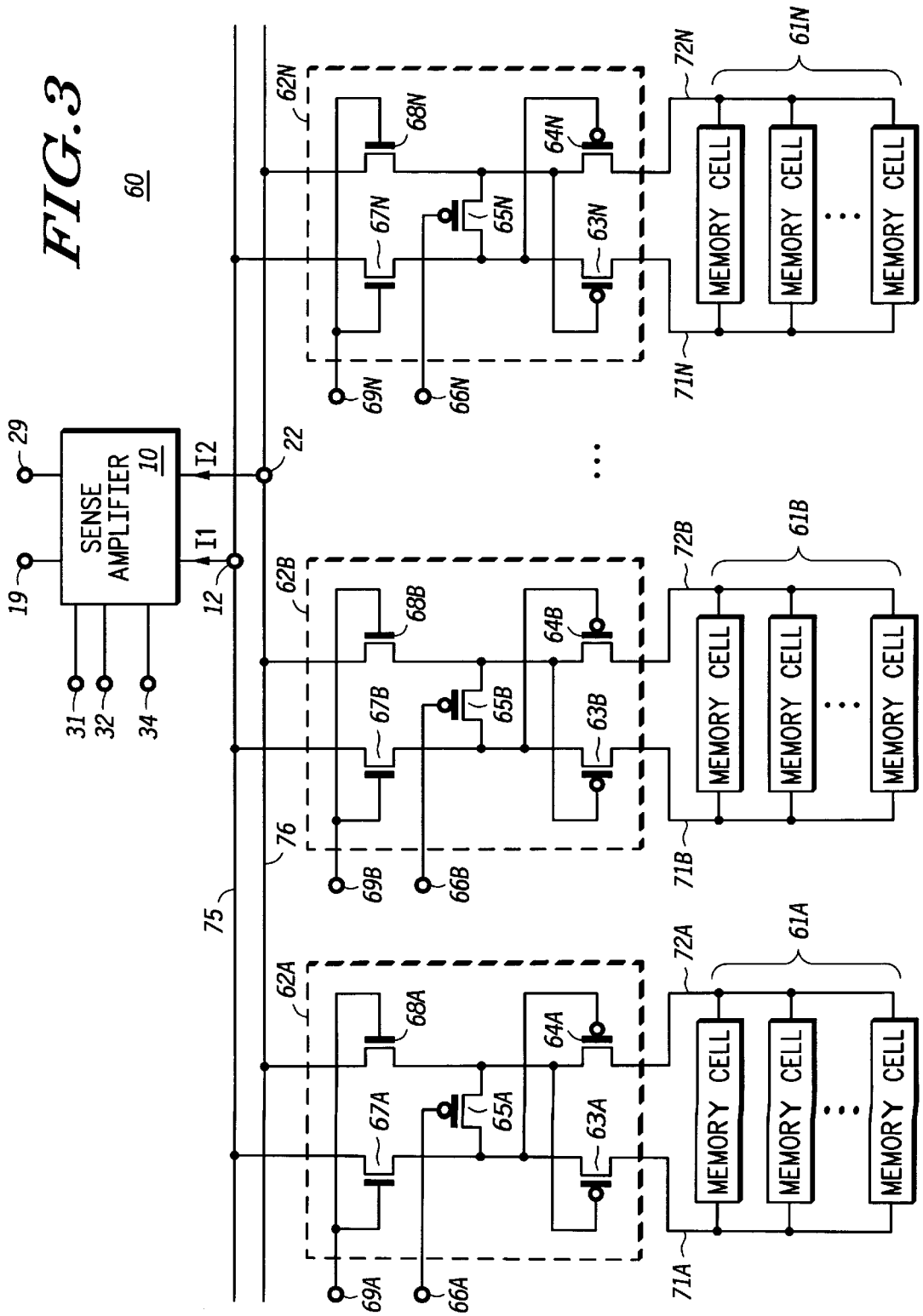
FIG. 3 is a schematic diagram of a memory unit in accordance with the present invention.

FIG. 3 is a schematic diagram of a memory unit 60 in accordance with the present invention. Memory unit 60 includes a current sensing circuit, such as sense amplifier 10 of FIG. 1, and a plurality of memory cell arrays 61A, 61B, ..., 61N coupled to sense amplifier 10 via first stage current sensing circuits 62A, 62B, ..., 62N, respectively. Therefore, sense amplifier 10 is also referred to as a second stage current sensing circuit of memory unit 60.

First stage current sensing circuit 62A includes p-channel insulated gate FETs 63A, 64A, 65A, and n-channel insulated gate FETs 67A and 68A. A bit line 71A of memory cell array 61A is connected to a source electrode of FET 63A. A complementary bit line 72A of memory cell array 61A is connected to a source electrode of FET 64A. A drain electrode of FET 63A is connected to a gate electrode of FET 64A and to a source electrode of FET 65A. A drain electrode of FET 64A is connected to a gate electrode of FET 63A and to a drain electrode of FET 65A. A gate electrode of FET 65A is connected to a terminal 66A of first stage current sensing circuit 62A for receiving an equalization signal. The source electrode of FET 65A is also connected to a drain electrode of FET 67A, and the drain electrode of FET 65A is also connected to a drain electrode of FET 68A. The gate electrodes of FETs 67A and 68A are connected to a terminal 69A for receiving a selection signal. A source electrode of FET 67A is coupled to input terminal 12 of sense amplifier 10 via a global bit line 75. A source electrode of FET 68A is coupled to complementary input terminal 22 of sense amplifier 10 via a global complementary bit line 76.

First stage current sensing circuit 62B includes p-channel insulated gate FETs 63B, 64B, 65B, and n-channel insulated gate FETs 67B and 68B. A bit line 71B of memory cell array 61B is connected to a source electrode of FET 63B. A complementary bit line 72B of memory cell array 61B is connected to a source electrode of FET 64B. A drain electrode of FET 63B is connected to a gate electrode of FET 64B and to a source electrode of FET 65B. A drain electrode of FET 64B is connected to a gate electrode of FET 63B and to a drain electrode of FET 65B. A gate electrode of FET 65B is connected to a terminal 66B of first stage current sensing circuit 62B for receiving an equalization signal. The source electrode of FET 65B is also connected to a drain electrode of FET 67B, and the drain electrode of FET 65B is also connected to a drain electrode of FET 68B. The gate electrodes of FETs 67B and 68B are connected to a terminal 69B for receiving a selection signal. A source electrode of FET 67B is coupled to input terminal 12 of sense amplifier 10 via a global bit line 75. A source electrode of FET 68B is coupled to complementary input terminal 22 of sense amplifier 10 via a global complementary bit line 76.

First stage current sensing circuit 62N includes p-channel insulated gate FETs 63N, 64N, 65N, and n-channel insulated gate FETs 67N and 68N. A bit line 71N of memory cell array 61N is connected to a source electrode of FET 63N. A complementary bit line 72N of memory cell array 61N is connected to a source electrode of FET 64N. A drain electrode of FET 63N is connected to a gate electrode of FET 64N and to a source electrode of FET 65N. A drain electrode of FET 64N is connected to a gate electrode of FET 63N and to a drain electrode of FET 65N. A gate electrode of FET 65N is connected to a terminal 66N of first stage current sensing circuit 62N for receiving an equalization signal. The source electrode of FET 65N is also connected to a drain electrode of FET 67N, and the drain electrode of FET 65N is also connected to a drain electrode of FET 68N. The gate electrodes of FETs 67N and 68N are connected to a terminal 69N for receiving a selection signal. A source electrode of FET 67N is coupled to input terminal 12 of sense amplifier 10 via a global bit line 75. A source electrode of FET 68N is coupled to complementary input terminal 22 of sense amplifier 10 via a global complementary bit line 76.

It should be noted that FETs 63A–63N, 64A–64N, 65A–65N, 67A–67N, and 68A–68N are not limited to being insulated gate FETs as shown in FIG. 3. These elements can be replaced with other kinds of transistors such as, for example, bipolar transistors, metal semiconductor FETs, junction FETs, insulated gate bipolar transistors, etc. FETs 67A–67N and 68A–68N function as switches and can be replaced by other kinds of switches having control electrodes and current conducting electrodes. FETs 65A–65N function as pass gates and can be replaced by different types of pass gates, e.g., two transistor pass gates. Like the pass gate formed by FET 38 in sense amplifier 10 of FIG. 1, the pass gate formed by FETs 65A–65N are optional in the respective first stage current sensing circuits 62A–62N. Terminals 66A–66N receive equalization signals for the respective first stage current sensing circuits 62A–62N and control the respective pass gate FETs 65A–65N. Terminals 66A–66N can be coupled together for receiving an equalization signal which is substantially synchronized with equalization signal 54 of FIG. 2.

It should also be noted that a memory unit, such as memory unit 60, may include any number of sense amplifiers, wherein each sense amplifier may be coupled to any number of memory cell arrays via the respective first stage current sensing circuits, and each memory cell array may include any number of memory cells. For example, a memory unit has 8M memory cells storing M bytes of data and the data are read from the memory unit L bytes at a time, where M, L, and M/L are integers. The memory unit preferably has 8L sense amplifiers. Each sense amplifier is preferably coupled to M/L memory cells. The M/L memory cells coupled to each sense amplifier, e.g., sense amplifier 10, may be partitioned into K arrays of memory cells, e.g., memory cell arrays 61A–61N, and each array includes M/(KL) memory cells, wherein K and M/(KL) are integers.

To sense data from a selected memory cell in memory cell array 61A, a selection signal is applied to terminal 69A. FETs 67A and 68A are switched on, electrically coupling bit line 71A and complementary bit line 72A to global bit line 75 and global complementary bit line 76, respectively. During the process of sensing data from the selected memory cell in memory cell array 61A, FETs 67B–67N and 68B–68N are nonconductive and, therefore, electrically disconnect bit lines 71B–71N and complementary bit lines 72B–72N from global bit line 75 and global complementary bit line 76, respectively.

Before the sensing process starts, a low voltage level, e.g., ground voltage level, is applied to terminal 66A, thereby switching FET 65A on. Conductive FET 65A substantially equalizes the potentials at the drain electrode of FET 63A and at the drain electrode of FET 64A. The sensing process starts when the voltage level at terminal 66A is switched to a high voltage level, e.g., $V_{DD}$. FET 65A is switched off, electrically isolating the drain electrode of FET 63A from the drain electrode of FET 64A. Preferably, the equalization signal applied to terminal 66A of first stage current sensing circuit 62A is substantially synchronized with equalization signal 54 of FIG. 2, which is applied to terminal 34 of sense amplifier 10.

During the sensing process, the current in bit line 71A flows to input terminal 12 via FETs 63A and 67A, and global bit line 75, thereby providing current $I_1$ for sense amplifier 10. Likewise, the current in complementary bit line 72A flows to complementary input terminal 22 via FETs 64A and 68A, and global complementary bit line 76, thereby providing current I2 for sense amplifier 10. FETs 63A and 64A form a latch circuit which minimizes the voltage swing across bit line 71A and complementary bit line 72A. Because of the small voltage swing across bit line 71A and complementary bit line 72A, e.g., less than approximately 20 mV, memory unit 60 is suitable for use in high speed applications.

If the selected memory cell in memory cell array 61A stores a logic "1", the current flowing in bit line 71A is slightly greater than the current flowing in complementary bit line 72A. Typically, the difference between the two currents ranges between approximately 40 $\mu$A and approximately 80 $\mu$A. A nominal value for the current difference is approximately 60 $\mu$A. Therefore, current $I_1$ is slightly greater than current $I_2$. As described hereinbefore with reference to FIGS. 1 and 2, a high voltage level, e.g., $V_{DD}$, is generated at output terminal 19 and a low voltage level, e.g., ground voltage level, is generated at complementary output terminal 29, thereby reading a logic "1" from the selected memory cell in memory cell array 61A.

If the selected memory cell in memory cell array 61A stores a logic "0", the current flowing in bit line 71A is slightly less than the current flowing in complementary bit line 72A. Therefore, current $I_1$ is slightly less than current $I_2$. As described hereinbefore with reference to FIGS. 1 and 2, a low voltage level, e.g., ground voltage level, is generated at output terminal 19 and a high voltage level, e.g., $V_{DD}$, is generated at complementary output terminal 29, thereby reading a logic "0" from the selected memory cell in memory cell array 61A.

The processes of sensing data from selected memory cells in memory cell arrays 61B, . . . , 61N are analogous to the process of sensing data from the selected memory cell in memory cell array 61A. When sensing data from a selected memory cell in memory cell array 61B, FETs 67B and 68B are switched on by a selection signal applied to terminal 69B, thereby coupling bit line 71B and complementary bit line 72B to global bit line 75 and global complementary bit line 76, respectively. Similarly, when sensing data from a selected memory cell in memory cell array 61N, FETs 67N and 68N are switched on by a selection signal applied to terminal 69N, thereby coupling bit line 71N and complementary bit line 72N to global bit line 75 and global complementary bit line 76, respectively.

By now it should be appreciated that a circuit and a process for sensing data have been provided. The circuit of the present invention senses data by sensing the currents flowing in the bit line and the complementary bit line. During the sensing process, the voltage swing across the bit line and the complementary bit line is maintained at a minimum level. Therefore, the circuit and the data sensing process are suitable for use in high speed and long bit line applications. In accordance with the present invention, the circuit does not include a high gain differential voltage amplifier and is, therefore, power efficient compared with prior art sense amplifiers. In a preferred embodiment of the present invention, the voltage levels at the output terminals of the circuit are either pulled up to $V_{DD}$ or pulled down to ground when an output signal is generated by the circuit. Therefore, the circuit and the data sensing process are compatible with standard CMOS logic levels.

We claim:

1. A current sensing circuit, comprising:

a first current source having a control electrode, a first current conducting electrode, and a second current conducting electrode;

a second current source having a control electrode coupled to the control electrode of the first current source, a first current conducting electrode coupled to the first current conducting electrode of the first current source, and a second current conducting electrode;

a first transistor of a first conductivity type, the first transistor having a control electrode coupled to the second current conducting electrode of the second current source, a first current conducting electrode, and a second current conducting electrode coupled to the second current conducting electrode of the first current source;

a second transistor of the first conductivity type, the second transistor having a control electrode coupled to the second current conducting electrode of the first current source, a first current conducting electrode, and a second current conducting electrode coupled to the second current conducting electrode of the second current source;

a third transistor of a second conductivity type, the third transistor having a control electrode coupled to the control electrode of the first transistor, a first current conducting electrode coupled to the second current conducting electrode of the first transistor, and a second current conducting electrode coupled to a power supply voltage terminal and a fourth transistor of the second conductivity type, the fourth transistor having a control electrode coupled to the control electrode of the second transistor, a first current conducting electrode coupled to the second current conducting electrode of the second transistor, and a second current conducting electrode coupled to the power supply voltage terminal a first current sink coupled to the first current conducting electrode of the first transistor;

a second current sink coupled to the first current conducting electrode of the second transistor; and a current signal generating circuit having a first output coupled to the first current conducting electrode of the first transistor, a second output terminal coupled to the first current conducting electrode of the second transistor, the current signal generating circuit providing a differential current signal between the first and second output terminals thereof.

2. The current sensing circuit of claim 1, wherein:

the first current sink includes a third transistor of the first conductivity type, the third transistor having a control electrode coupled to the first current conducting electrode of the first current source, a first current conducting electrode, and a second current conducting electrode coupled to the first current conducting electrode of the first transistor; and the second current sink includes a fourth transistor of the first conductivity type, the fourth transistor having a control electrode coupled to the control electrode of the third transistor, a first current conducting electrode coupled to the first current conducting electrode of the third transistor, and a second current conducting electrode coupled to the first current conducting electrode of the second transistor.

3. The current sensing circuit of claim 1, further comprising:

a first switch having a control electrode, a first current conducting electrode coupled to the second current conducting electrode of the first current source, and a second current conducting electrode coupled to the second current conducting electrode of the second current source.

4. The current sensing circuit of claim 3, wherein the first current source, the second current source, and the first switch are transistors of the second conductivity type.

5. The current sensing circuit of claim 3, further comprising a second switch coupled between the second current conducting electrode of the first transistor and the second current conducting electrode of the second transistor.

6. The current sensing circuit of claim 5, further comprising a third switch coupled between the first current conducting electrode of the first transistor and the first current conducting electrode of the second transistor.

7. The current sensing circuit of claim 5, further comprising:

a third switch having a control electrode, a first current conducting electrode coupled to the first current conducting electrode of the first transistor, and a second current conducting electrode; and a fourth switch having a control electrode coupled to the control electrode of the third switch, a first current conducting electrode coupled to the first current conducting electrode of the second transistor, and a second current conducting electrode.

8. The current sensing circuit of claim 7, further comprising:

a first current sensing transistor of the second conductivity type, the first current sensing transistor having a control electrode coupled to the second current conducting electrode of the fourth switch, a first current conducting electrode, and a second current conducting electrode coupled to the second current conducting electrode of the third switch; and a second current sensing transistor of the second conductivity type, the second current sensing transistor having a control electrode coupled to the second current conducting electrode of the third switch, a first current conducting electrode, and a second current conducting electrode coupled to the second current conducting electrode of the fourth switch.

9. The current sensing circuit of claim 8, further comprising a fifth switch coupled between the second current conducting electrode of the first current sensing transistor and the second current conducting electrode of the second current sensing transistor.

10. A sense amplifier, comprising:

a first inverter having a first biasing node, a second biasing node coupled for receiving a first input signal of the sense amplifier, an input, and an output coupled for transmitting a first output signal of the sense amplifier;

a second inverter having a first biasing node, a second biasing node coupled for receiving a second input signal of the sense amplifier, an input coupled to the output of the first inverter, and an output coupled to the input of the first inverter and coupled for transmitting a second output signal of the sense amplifier;

a first switch having a control electrode coupled for receiving a first enabling signal, a first current conducting electrode coupled for receiving a first voltage level, and a second current conducting electrode coupled to the output of the first inverter;

a second switch having a control electrode coupled to the control electrode of the first switch, a first current conducting electrode coupled to the first current conducting electrode of the first switch, and a second current conducting electrode coupled to the output of the second inverter;

a third switch having a control electrode coupled for receiving a second enabling signal, a first current conducting electrode coupled to the first current conducting electrode of the first switch, and a second current conducting electrode coupled to the first biasing node of the first inverter and to the first biasing node of the second inverter;

a first current sink coupled to the second biasing node of the first inverter; and a second current sink coupled to the second biasing node of the second inverter.

11. The sense amplifier of claim 10, wherein:

the first inverter includes:

a first pull-up transistor having a control electrode coupled to the input of the first inverter, a first current conducting electrode coupled to the first biasing node of the first inverter, and a second current conducting electrode coupled to the output of the first inverter; and a first pull-down transistor having a control electrode coupled to the control electrode of the first pull-up transistor, a first current conducting electrode coupled to the second biasing node of the first inverter, and a second current conducting electrode coupled to the second current conducting electrode of the first pull-up transistor; and the second inverter includes:

a second pull-up transistor having a control electrode coupled to the input of the second inverter, a first current conducting electrode coupled to the first biasing node of the second inverter, and a second current conducting electrode coupled to the output of the second inverter; and a second pull-down transistor having a control electrode coupled to the control electrode of the second pull-up second transistor, a first current conducting electrode coupled to the second biasing node of the second inverter, and a second current conducting electrode coupled to the second current conducting electrode of the second pull-up transistor.

12. The sense amplifier of claim 10, further comprising a first pass gate coupled between the output of the first inverter and the output of the second inverter.

13. The sense amplifier of claim 12, wherein the first pass gate is a two-transistor pass gate.

14. The sense amplifier of claim 12, further comprising a second pass gate coupled between the second biasing node of the first inverter and the second biasing node of the second inverter.

15. The sense amplifier of claim 10, wherein:

the second biasing node of the first inverter is coupled for receiving the first input signal via a first current sensing transistor and a fourth switch, the first current sensing transistor having a control electrode, a first current conducting electrode coupled for receiving a third input signal, and a second current conducting electrode, the fourth switch having a control electrode coupled for receiving a selection signal, a first current conducting electrode coupled to the second biasing node of the first inverter, and a second current conducting electrode coupled to the second current conducting electrode of the first current sensing transistor; and the second biasing node of the second inverter is coupled for receiving the second input signal via a second current sensing transistor and a fifth switch, the second current sensing transistor having a control electrode coupled to the second current conducting electrode of the first current sensing transistor, a first current conducting electrode coupled for receiving a fourth input signal, and a second current conducting electrode coupled to the control electrode of the first current sensing transistor, the fifth switch having a control electrode coupled to the control electrode of the fourth switch, a first current conducting electrode coupled to the second biasing node of the second inverter, and a second current conducting electrode coupled to the second current conducting electrode of the second current sensing transistor.

16. The sense amplifier of claim 15, further comprising a pass gate coupled between the second current conducting electrode of the first current sensing transistor and the second current conducting electrode of the second current sensing transistor.

17. A current sensing circuit comprising:

a first inverter having an input terminal, an output terminal for providing a first output signal, a first power supply terminal coupled to a first power supply voltage terminal, and a second power supply terminal for receiving a first input current signal;

a second inverter having an input terminal coupled to said output terminal of said first inverter, an output terminal coupled to said input terminal of said first inverter for providing a second output signal, a first power supply terminal coupled to said first power supply voltage terminal, and a second power supply terminal for receiving a second input current signal;

a first current source having a first current conducting electrode coupled to said second supply terminal of said second inverter, and a second current conducting electrode coupled to a second power supply voltage terminal, for conducting a first current;

a second current source having a first current conducting electrode coupled to said input terminal of said first inverter, and a second current conducting electrode coupled to said second power supply voltage terminal, for conducting a second current; and a current signal generating circuit having a first output coupled to the first current conducting electrode of the first current source, a second output terminal coupled to the first current conducting electrode of the second current source, the current signal generating circuit providing a differential current signal between the first and second output terminals thereof.

18. The current sensing circuit of claim 17 further comprising:

a third current source having a first current conducting electrode coupled to said input terminal of said second inverter, and a second current conducting electrode coupled to said first power supply voltage terminal, for conducting a third current; and a fourth current source having a first current conducting electrode coupled to said input terminal of said first inverter, and a second current conducting electrode coupled to said first power supply voltage terminal, for conducting a fourth current.

19. The current sensing circuit of claim 17 wherein said first inverter comprises:

a first transistor having a first current electrode coupled to said first power supply terminal of said first inverter, a control electrode coupled to said input terminal of said first inverter, and a second current electrode coupled to said output terminal of said first inverter; and a second transistor having a first current electrode coupled to said second current electrode of said first transistor, a control electrode coupled to said input terminal of said first inverter, and a second current electrode for receiving said first input current signal.

20. The current sensing circuit of claim 19 wherein said second inverter comprises:

a third transistor having a first current electrode coupled to said first power supply terminal of said second inverter, a control electrode coupled to said input terminal of said second inverter, and a second current electrode coupled to said output terminal of said second inverter; and a fourth transistor having a first current electrode coupled to said second current electrode of said third transistor, a control electrode coupled to said input terminal of said second inverter, and a second current electrode for receiving said second input current signal.

* * * * *

UNITED STATES PATENT AND TRADEMARK OFFICE
CERTIFICATE OF CORRECTION

Page 1 of 1

PATENT NO. : 5,929,659
DATED : July 27, 1999
INVENTOR(S) : Dimitris C. Pantelakis et al.

It is certified that error appears in the above-identified patent and that said Letters Patent is hereby corrected as shown below:

<u>Claim 4, column 10,</u>
Line 43; after the word claim, change "3" to read --1--.

<u>Claim 5, column 10,</u>
Line 45; after the word claim, change "3" to read --1--.

Signed and Sealed this

Tenth Day of July, 2001

*Nicholas P. Godici*

Attest:

Attesting Officer

NICHOLAS P. GODICI
*Acting Director of the United States Patent and Trademark Office*